United States Patent
Velury et al.

(10) Patent No.: US 10,204,111 B2
(45) Date of Patent: *Feb. 12, 2019

(54) SYSTEM AND METHOD FOR COMPRESSING DATA IN A DATABASE

(71) Applicant: Futurewei Technologies, Inc., Plano, TX (US)

(72) Inventors: Ramabrahmam Velury, San Jose, CA (US); Jihui Tan, Shenzhen (CN); Guangcheng Zhou, Shenzhen (CN)

(73) Assignee: Futurewei Technologies, Inc., Plano, TX (US)

( * ) Notice: Subject to any disclaimer, the term of this patent is extended or adjusted under 35 U.S.C. 154(b) by 98 days.

This patent is subject to a terminal disclaimer.

(21) Appl. No.: 15/249,045

(22) Filed: Aug. 26, 2016

(65) Prior Publication Data

US 2016/0364402 A1    Dec. 15, 2016

Related U.S. Application Data

(63) Continuation of application No. 13/804,321, filed on Mar. 14, 2013, now Pat. No. 9,442,949.

(51) Int. Cl.
    *G06F 17/30*     (2006.01)
    *H03M 7/30*      (2006.01)

(52) U.S. Cl.
    CPC .. *G06F 17/30153* (2013.01); *G06F 17/30312* (2013.01); *G06F 17/30592* (2013.01);
    (Continued)

(58) Field of Classification Search
    None
    See application file for complete search history.

(56) References Cited

U.S. PATENT DOCUMENTS

| 7,630,996 | B1 | 12/2009 | Hershkovich |
| 7,647,291 | B2 | 1/2010 | Mosescu |

(Continued)

FOREIGN PATENT DOCUMENTS

CN    101311931 A    11/2008

OTHER PUBLICATIONS

Dehne, Frank, et al., "Compressing Data Cube in Parallel Olap Systems," Data Science Journal, Mar. 2007, 18 pages.

(Continued)

*Primary Examiner* — Alex Gofman
(74) *Attorney, Agent, or Firm* — Slater Matsil, LLP

(57) ABSTRACT

A method of compressing a plurality of multi-dimensional keys includes receiving, by a computer, the plurality of multi-dimensional keys, where the plurality of multi-dimensional keys have a first length and determining a first plurality of bit slots that are common among the plurality of multi-dimensional keys, wherein the first plurality of bit slots are not a prefix. Also, the method includes forming a mask indicating the first plurality of bit slots and forming a pattern indicating values of the first plurality of bit slots. Additionally, the method includes determining a second plurality of bit slots that vary among the plurality of multi-dimensional keys and forming a plurality of compressed multi-dimensional keys indicating values of the second plurality of bit slots. Further, the method includes storing the mask, the pattern, and the plurality of compressed multi-dimensional keys.

6 Claims, 11 Drawing Sheets

(52) U.S. Cl.
CPC ........... *H03M 7/30* (2013.01); *H03M 7/3084* (2013.01); *H03M 7/3088* (2013.01)

(56) References Cited

U.S. PATENT DOCUMENTS

| | | | |
|---|---|---|---|
| 7,739,445 | B1 | 6/2010 | Venkatachary |
| 8,255,398 | B2 | 8/2012 | Bhjattacharjee et al. |
| 2003/0191740 | A1 | 10/2003 | Stark |
| 2003/0208503 | A1 | 11/2003 | Roccaforte |
| 2005/0192941 | A1* | 9/2005 | Biedenstein ...... G06F 17/30489 |
| 2005/0237938 | A1 | 10/2005 | Corl, Jr. et al. |
| 2008/0147599 | A1* | 6/2008 | Young-Lai ........ G06F 17/30445 |
| 2008/0222136 | A1 | 9/2008 | Yates et al. |
| 2010/0223237 | A1 | 9/2010 | Mishra et al. |
| 2010/0287160 | A1 | 11/2010 | Pendar |
| 2012/0136889 | A1 | 5/2012 | Jagannathan et al. |
| 2014/0250090 | A1 | 9/2014 | Faerber et al. |

OTHER PUBLICATIONS

Goldstein, Jonathan, et al., "Compressing Relations and Indexes," ICDE 98 Proceedings of the Fourteenth International Conference on Data Engineering, Feb. 23-27, 1998, 10 pages.
International Search Report for Application No. PCT/CN2014/073404 dated Jun. 18, 2014.

* cited by examiner

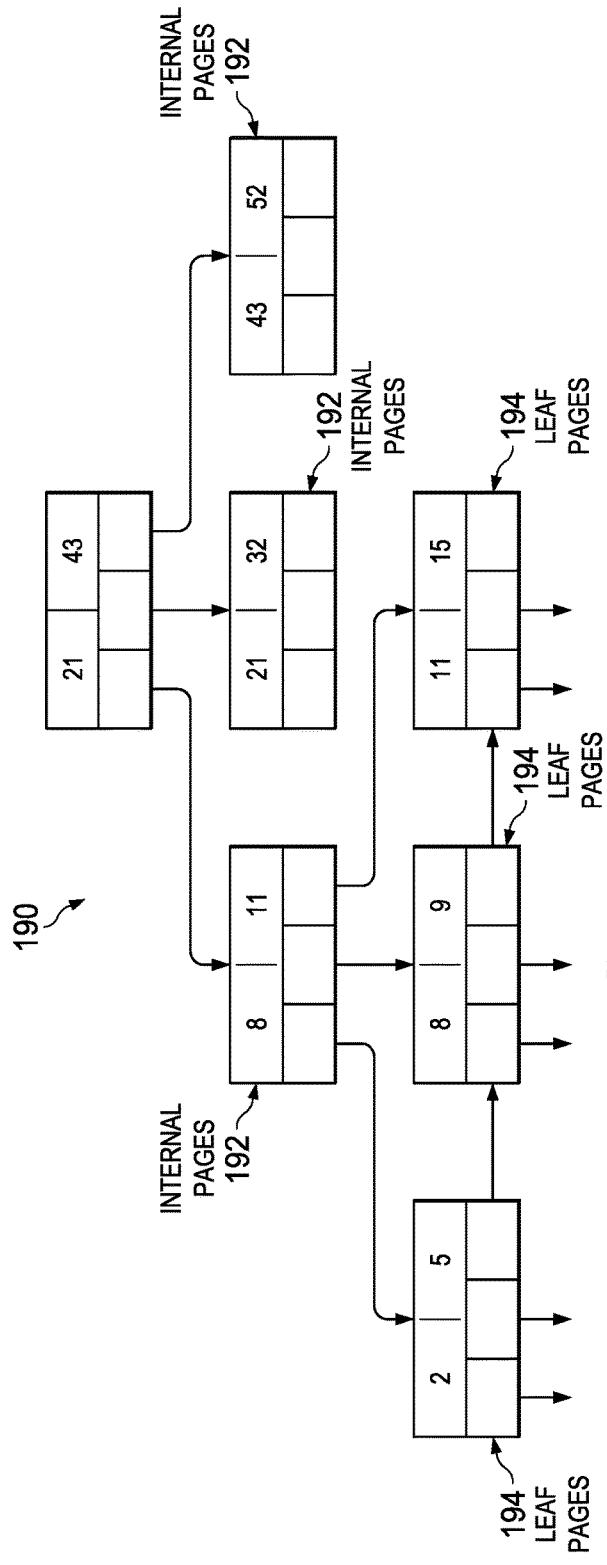

| Quarters | Months | Country | City | Line | Type | Customer | Sales |
|---|---|---|---|---|---|---|---|
| QTR1 | Feb | Australia | Melbourne | Motorcycles | Shipped | Australian Collectors, Co. | 8,056 |
| QTR1 | Feb | Australia | South Brisbane | Motorcycles | Shipped | Australian Gift Network, Co. | 5,288 |
| QTR1 | Feb | Australia | Sydney | Motorcycles | Shipped | Australian Collectors, Co. | 6,365 |
| QTR1 | Feb | Australia | Canberra | Motorcycles | Shipped | Australian Gift Network, Co. | 4,268 |

SYSTEM AND METHOD FOR COMPRESSING DATA IN A DATABASE

CROSS-REFERENCE TO RELATED APPLICATIONS

This application is a continuation of U.S. application Ser. No. 13/804,321, filed on Mar. 14, 2013, entitled "System and Method for Compressing Data in a Database," which application is hereby incorporated herein by reference.

TECHNICAL FIELD

The present invention relates generally to a system and method for compressing data and, in particular, to a system and method for compressing data in a database.

BACKGROUND

Databases are systems used to efficiently store and retrieve vast amounts of information. An example of a database system is an online transaction processing system (OLTP), which is used in day to day operations of a business. OLTP systems deal with short online transactions like insert/update/delete operations on a database. Also, OLTP systems deal with current business data.

Another example of a database system is an online analytical processing system (OLAP), which is a database storing business data to enable efficient analysis of data. OLAP systems are used in preparation of reports to management based on business data and in the management of business performance through activities like planning, budgeting, and forecasting. Unlike OLTP systems, OLAP systems deal with analytical queries which are low in volume compared to transactional queries, but involve complex queries with a large amount of processing of data.

OLAP systems view business data as a collection of facts. Each fact is a data point characterized by a set of dimensions and a set of measurement values. With the multi-dimensional perspective, users can view data by slicing and dicing along different dimensions to get an in-depth understanding of data by identifying useful patterns within the data, which can be used to improve the future performance of the business. An example of an OLAP system is a relational OLAP system (ROLAP), where data is stored in a relational database. Another example of an OLAP system is a multi-dimensional OLAP system (MOLAP), which is a database that stores business data in a custom multi-dimensional format.

SUMMARY

An embodiment method of compressing a plurality of multi-dimensional keys includes receiving, by a computer, the plurality of multi-dimensional keys, where the plurality of multi-dimensional keys have a first length and determining a first plurality of bit slots that are common among the plurality of multi-dimensional keys, where the first plurality of bit slots are not a prefix. Also, the method includes forming a mask indicating the first plurality of bit slots and forming a pattern indicating values of the first plurality of bit slots. Additionally, the method includes determining a second plurality of bit slots that vary among the plurality of multi-dimensional keys and forming a plurality of compressed multi-dimensional keys indicating values of the second plurality of bit slots. Further, the method includes storing the mask, the pattern, and the plurality of compressed multi-dimensional keys.

In accordance with another embodiment, a method of searching for a first search key includes receiving, by a first computer, from a second computer, the first search key and determining if the first search key matches a first pattern and a first mask. Also, the method includes determining if the first search key matches a first compressed key and the first mask without decompressing the first compressed key when the first search key matches the first pattern and the first mask and indicating, by the first computer, a successful match when the first search key matches the first compressed key and the first mask.

An embodiment method of compressing a plurality of records includes receiving, by a first computer, a first record of the plurality of records and comparing a first bit in a first bit position of the first record to a second bit in the first bit position of a second record of the plurality of records. Also, the method includes assigning a third bit in the first bit position of a mask to a first binary value when the first bit of the first record does not equal the second bit of the second record and assigning a fourth bit in the first bit position of a pattern to a first binary value when the first bit of the first record does not equal the second bit of the second record. Additionally, the method includes assigning a fifth bit in a second bit position of a first compressed key to a value of the first bit of the first record and assigning a sixth bit in the second bit position of a second compressed key to a value of the second bit of the second record. The method also includes comparing a seventh bit in a third bit position of the first record to an eighth bit in the third position of the second record, where the third bit position is after the first bit position and assigning a ninth bit in the third bit position of the mask to a second binary value when the seventh bit of the first record equals the second bit of the second record. Further, the method includes assigning a tenth bit in the third bit position of the pattern to a value of the seventh bit of the first record when the seventh bit of the first record equals the eighth bit of the second record and storing the mask, the pattern, the first compressed key, and the second compressed key.

An embodiment database server includes a processor and a computer readable storage medium storing programming for execution by the processor. The programming including instructions to receive, by the database server, from a computer, a search key and determine if the search key matches a pattern and a mask and determine if the search key matches a compressed key and the mask when the search key matches the pattern and the mask. Also, the programming includes instructions to indicate a successful match when the search key matches the compressed key and the mask.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 3 illustrates an embodiment multi-dimensional data;

FIG. 5 illustrates an embodiment page structure;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Multi-dimensional online analytical processing (MOLAP) systems store the data in a custom multi-dimensional format. In a MOLAP system, the multi-dimensional data is stored using a multi-dimensional index, where each fact in the data is identified by a multi-dimensional key. The multi-dimensional key contains individual components, where each component is a key from one of the dimensions for a record.

Figure 1:
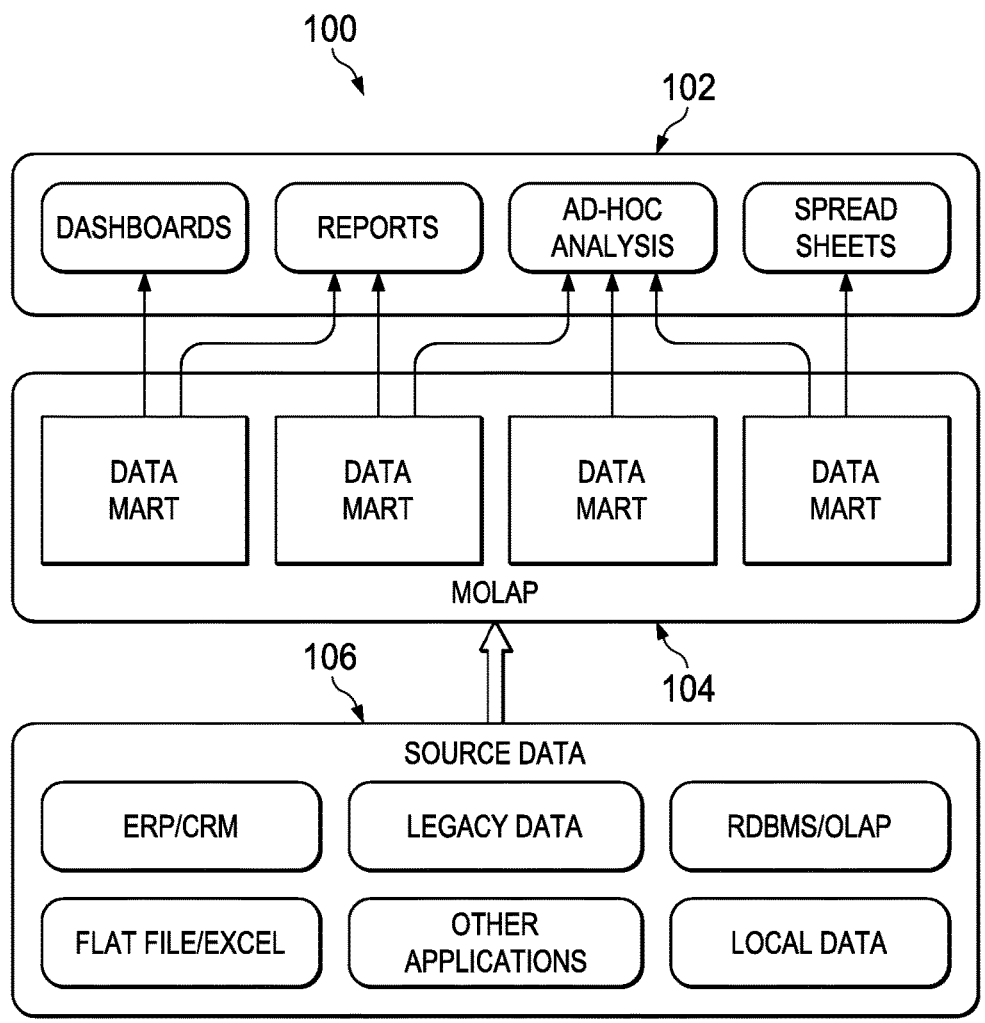
FIG. 1 illustrates an embodiment multi-dimensional online analytical processing (MOLAP) system.

FIG. 1 illustrates embodiment MOLAP system 100. MOLAP system 100 includes source data 106, MOLAP level 104, and outputs 102. Source data 106 may include enterprise resource planning (ERP) or customer relationship management (CRM), legacy data, relational database management system (RDMBS) or OLAP, flat files or excel files, other applications, and local data. Also, MOLAP level 104 may include data marts, which are the access layer of the data warehouse environment that is used to get data to the users. Outputs 102 may include dashboards, reports, ad-hoc analysis, and spreadsheets.

Figure 2:
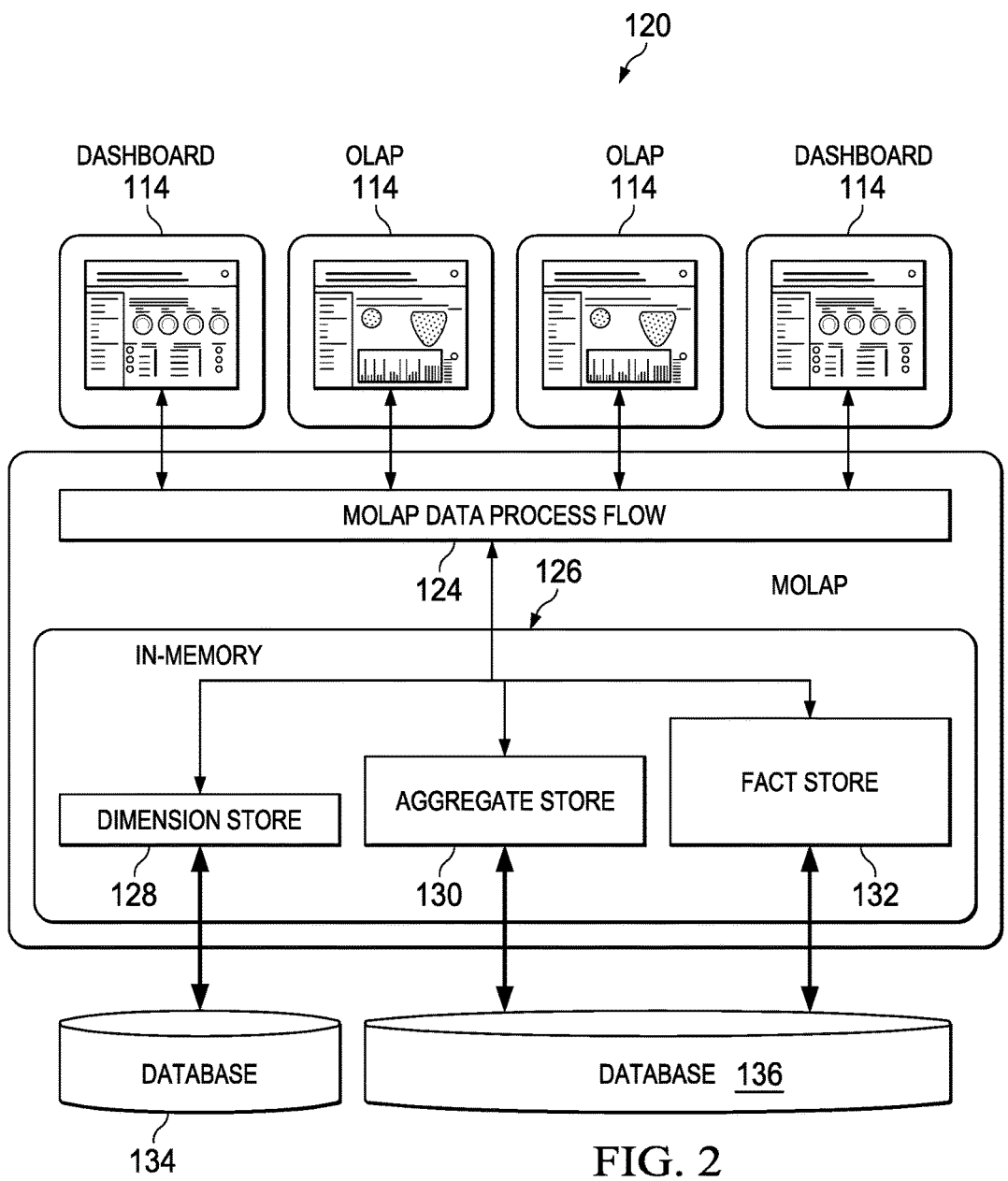
FIG. 2 illustrates another embodiment MOLAP system.

In one example, MOLAP databases are stored entirely in-memory to provide extremely fast responses to analytical queries. FIG. 2 illustrates an in-memory MOLAP system 120. In-memory MOLAP system 120 includes outputs 114 such as dashboards and OLAPs. Also, MOLAP system 120 includes MOLAP data processing flow 124 and in-memory storage 126. In-memory storage 126 includes dimension store 128, which is stored in first database 134, aggregate store 130, which is stored in second database 136, and fact store 132, which is also stored in second database 136.

MOLAP systems enable analysis of data using a multi-dimensional data model. Each fact in a MOLAP system has a collection of business metrics or measures and a collection of dimensional attributes. The metrics or measures are numerical quantities denoting the performance of the business. Examples of metrics include the number of units sold of a specific product and revenue generated from the sale of a specific product. Dimensions provide the context for metrics. For example, the number of units sold is qualified by the specific product that has been sold, the category of the product sold, the date and time the sale has been made, the customer who purchased the product, the store where the sale has been made, the customer, and the department. The data may be analyzed along different dimensions such as products, time, customers, and store to look for specific information that helps in measuring the performance of a business, and that can be used to take actions to improve the performance of the systems.

MOLAP systems store the business fact data as a collection of multi-dimensional key values where each key is associated with a set of metrics. A multi-dimensional key is formed by joining the dimensions and attributes that provide the context for a business metric. FIG. 3 illustrates a leaf page of multi-dimensional keys 170. Page of multi-dimensional keys 170 includes the dimensional attributes of a time dimension including the quarter and the month, a geography dimension including the country and the city, a product dimension, a shipping status dimension, and a customer dimension. Also, multi-dimensional key 170 includes a measure of the quantity shipped. Four records are illustrated in the page of multi-dimensional keys 170, although more or fewer records may be included in a page of multi-dimensional keys. The rows contain the metric value and a collection of attributes that provide a context for the metric. The dimension values in a single row concatenated together represent a multi-dimensional key for a record. MOLAP systems store the data using a multi-dimensional index that is indexed based on the multi-dimensional key values.

Figure 4:
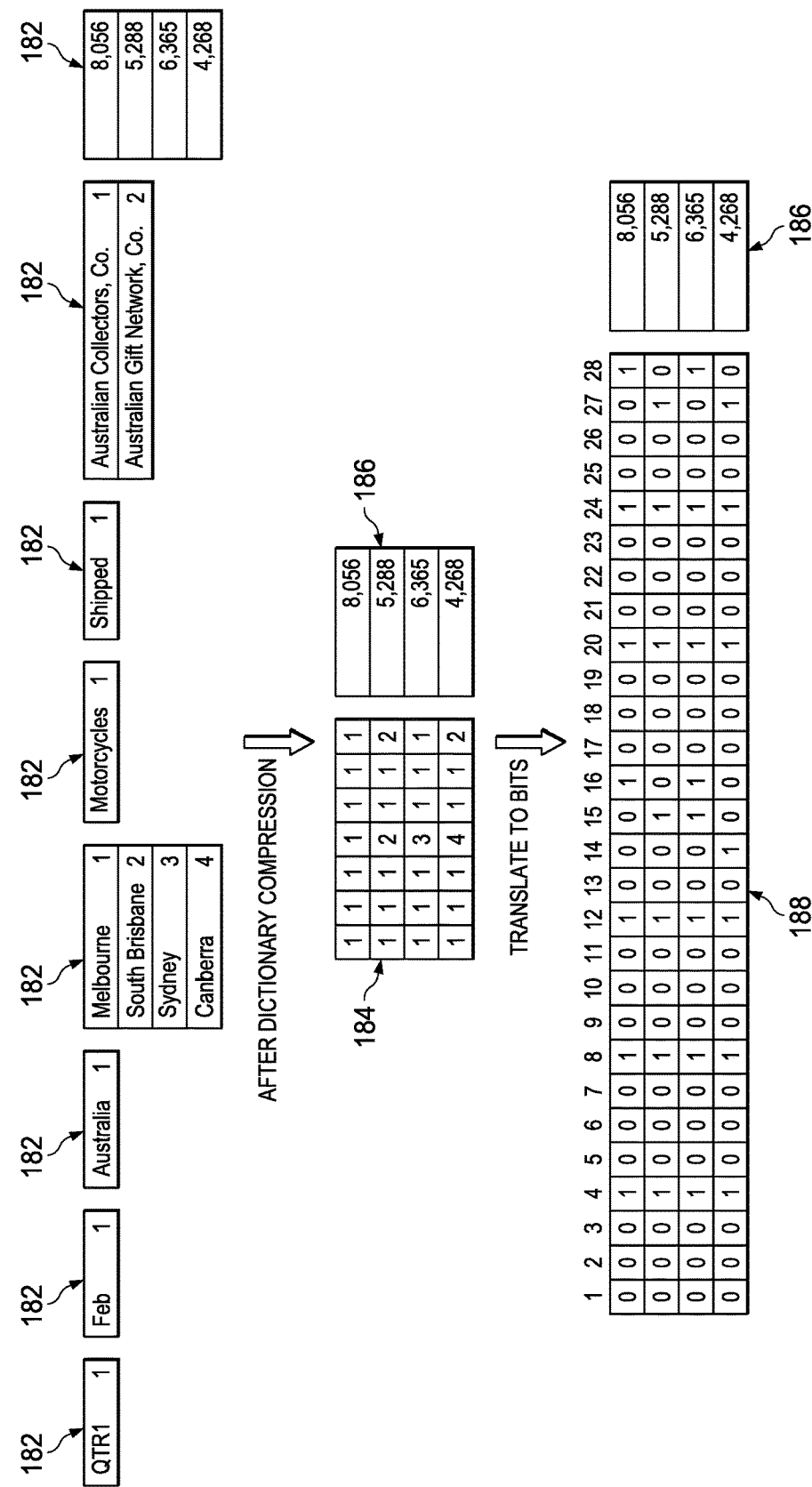
FIG. 4 illustrates data compression.

An example MOLAP system compresses the multi-dimensional keys. FIG. 4 illustrates the compression of a record including dictionary compression and bit translation. In dictionary compression, instead of storing each dimension value in a row, each unique value in a dimension is assigned an encoded numeric value, and the encoded numerical value is stored in the database. The encoding scheme may be stored separately in a dictionary, so that the original values can be rebuilt based on the encoded values. Multi-dimensional key 182 is encoded to yield encoded key 184 and measures 186. For the records in the multi-dimensional key 182, all of the records are in the first quarter, in February, in Australia, with the product a motorcycle, and shipped, so each of these fields is assigned a value of 1. The cities includes Melbourne, which is assigned a value of 1, South Brisbane, which is assigned a value of 2, Sydney, which is assigned a value of 3, and Canberra, which is assigned a value of 4. Also, the clients are either Australian Collector, Co., which is assigned a value of 1, or the Australian Gift Network, Co., which is assigned a value of 2. When there is a dimensional field that is not already in the dictionary, a new dimensional value and corresponding assigned value is added to the dictionary. For example, if there is a new record where the location is Perth, Perth would be assigned a value of 5, and would be added to the dictionary. The dimensional attributes for each row is assigned a value in encoded key 184, while the measures 186 remains unchanged.

After dictionary compression is applied, the assigned values are translated to bits and the dimension values in each row are concatenated. Instead of concatenating original dimensional values, encoded numerical values are used. In another compression technique, while forming the multi-dimensional keys, instead of using full byte representations of the encoded values, only enough bits are used for each encoded value, based on the number of unique encoded values. The multi-dimensional keys 188 are formed by concatenating individual bits representing encoded values for each of the dimensions in encoded key 184.

Figure 6:
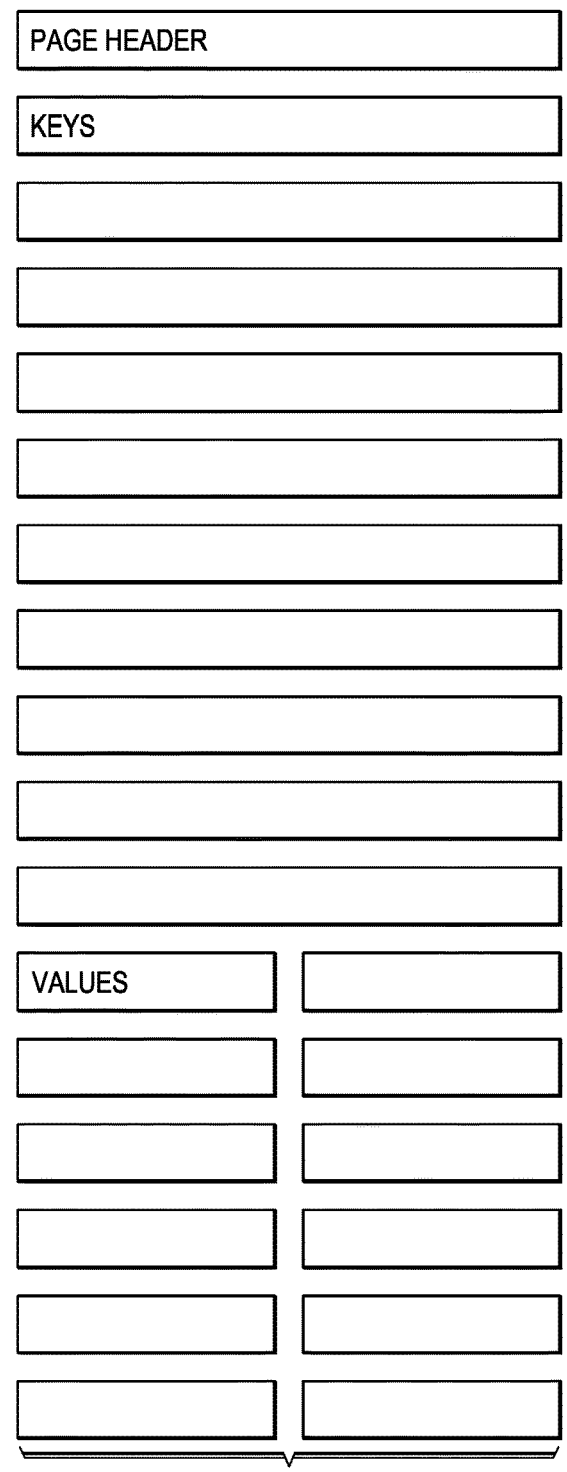
FIG. 6 illustrates an embodiment page.

In an example, the multi-dimensional index data is stored in an indexing structure such as a B+ tree or a CSB+ tree. FIG. 5 illustrates B+ tree indexing structure 190 which contains internal pages 192 and leaf pages 194, while FIG. 6 illustrates leaf page 195, which contains a page header, keys, and values. B+ trees, which may be used to store data in a block oriented storage context, may have a very high fan-out. There is a lot of redundant data in the collection of multi-dimensional keys in a single leaf page. Also, the multi-dimensional keys are all the same size. The multi-dimensional keys in a single leaf page are sorted by key value.

Figure 7:
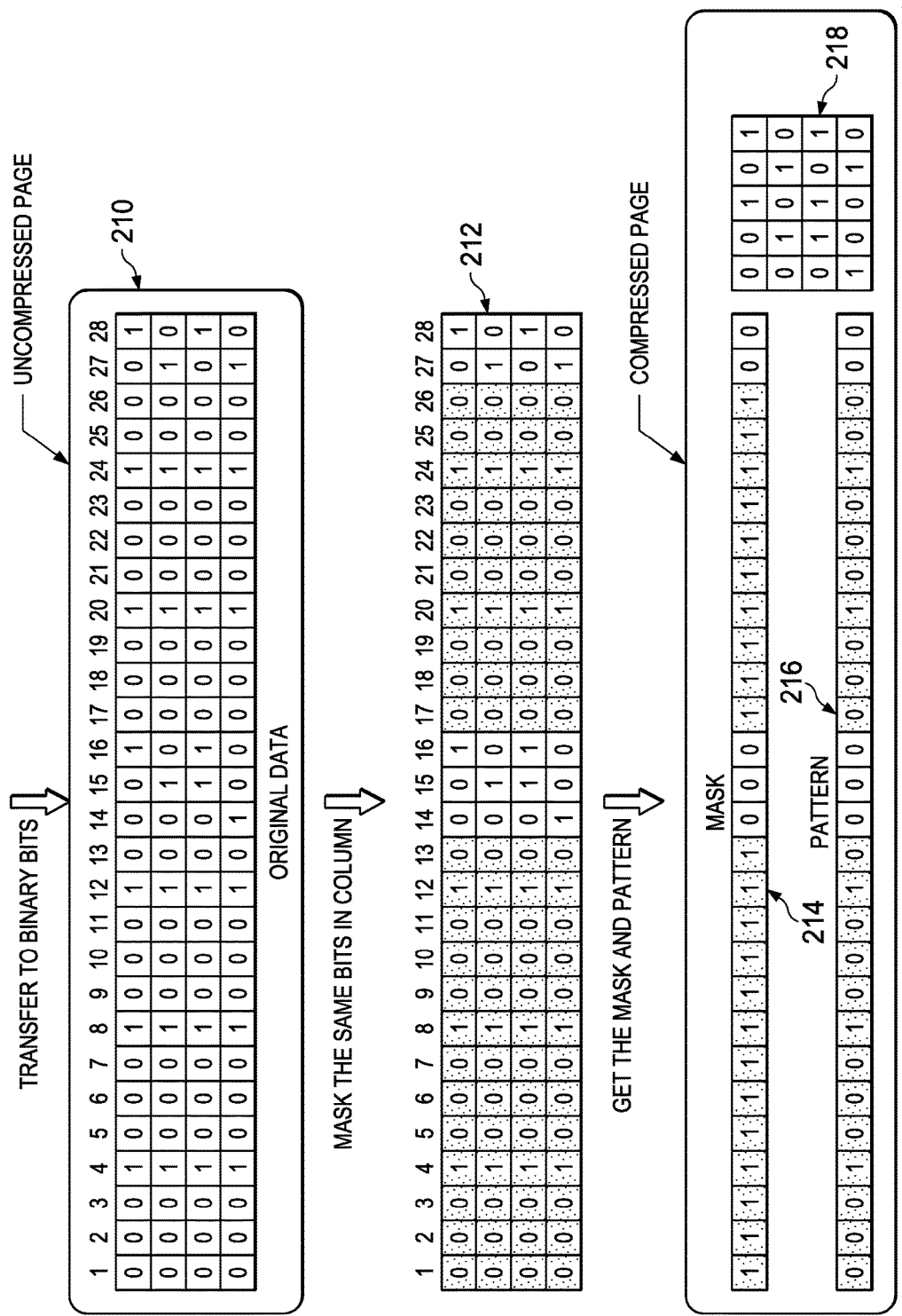
FIG. 7 illustrates data compression.

In an embodiment, all bits in a set of multi-dimensional keys in a single leaf page that are common across all multi-dimensional keys within the leaf page are factored out. The common bits are then stored separately in the page header as a pattern and a mask. FIG. 7 illustrates the compression of multi-dimensional keys. Data 210 in a concatenated bit format is masked to produce masked data 212, where the highlighted bits are common to all multi-dimensional keys in the leaf page, while the un-highlighted bits are different for some of the multi-dimensional keys in the leaf page. In an example, mask 214 is created, where a 1 indicates a bit that is common to all multi-dimensional keys, while a 0 indicates a bit that is different across the multi-dimensional keys. Alternatively, a 0 may indicate a bit that is the same across the multi-dimensional keys and a 1 may indicate a bit that is the different across the multi-dimensional keys. Additionally, a pattern is created where, for the bits that are the same across the multi-dimensional keys, that bit has the same value as the multi-dimensional keys. In one example, the bits of the pattern that are different across the multi-dimensional keys are assigned a value of 0. Alternately, the bits of the pattern that vary across the multi-dimensional keys may have a value of 1, or may be an arbitrary value. Also, compressed keys 218 include the bits from the record that are different across the multi-dimensional keys. In the example illustrated in FIG. 7, the bits from columns 14, 15, 16, 27, and 28 are included in compressed keys 218. The compressed key contains mask 214, pattern 216, and compressed keys 218.

Figure 8:
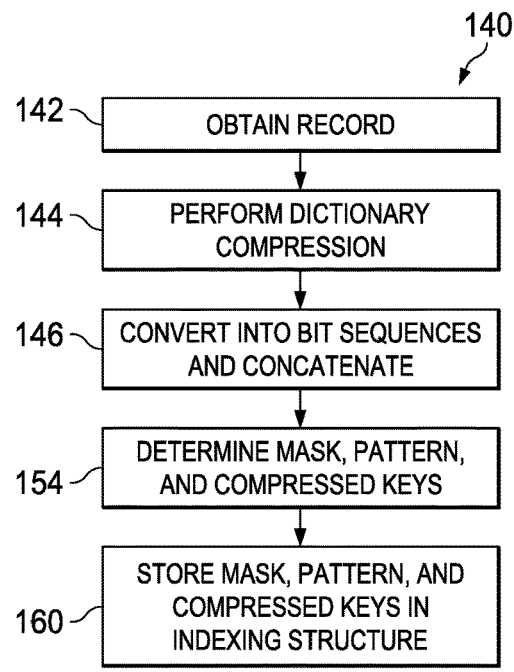
FIG. 8 illustrates an embodiment method of compressing a record.

FIG. 8 illustrates flowchart 140 of a method for compressing multi-dimensional keys. In one example, the system compresses all of the multi-dimensional keys in the leaf page. Alternatively, the system only compresses a new multi-dimensional key. Initially, in step 142, the system obtains a record. The record may be a new record to be added to the database. Next, in step 144, the system performs dictionary compression on the new record. If the new record has a dimensional value that is not already in the dictionary, the system adds the new dimensional value to the dictionary. Then, in step 146, the dictionary compressed key is converted to a bit sequence, and the bit sequence is concatenated. In one example, the bit sequence is not in byte format, but contains only the bits that are required for the dictionary compressed keys. After the bit sequence conversion and concatenation, the mask, pattern, and compressed multi-dimensional keys are determined in step 154. The mask indicates which bits are the same for all of the multi-dimensional keys in the leaf page. For example, a 1 may indicate that the bit is the same for all of the multi-dimensional keys, and a 0 may indicate that the bit is different for some of the multi-dimensional keys. For the bits that are the same for all of the multi-dimensional keys in the leaf page, the pattern indicates the bit values in the multi-dimensional keys. For the bits that are different for some of the multi-dimensional keys, the pattern may indicate a 0, a 1, or an arbitrary value. Also, the compressed multi-dimensional keys contain the bit values that are different for the different keys. Finally, in step 160, the mask, pattern and compressed keys are stored in an indexing structure, such as B+ tree or a CBS+ tree.

In an example, the compressed page may be searched directly without decompressing all of the multi-dimensional keys within a leaf page. The compressed keys as a group retain the order of the original uncompressed keys. Two types of searches may be performed on multi-dimensional keys within a leaf page. One example is a search for an exact match of a search key. Another example is a search for all multi-dimensional keys within a page that match a specific bit pattern. Both types of searches may be performed without decompressing all the multi-dimensional keys within the leaf page.

Figure 9:
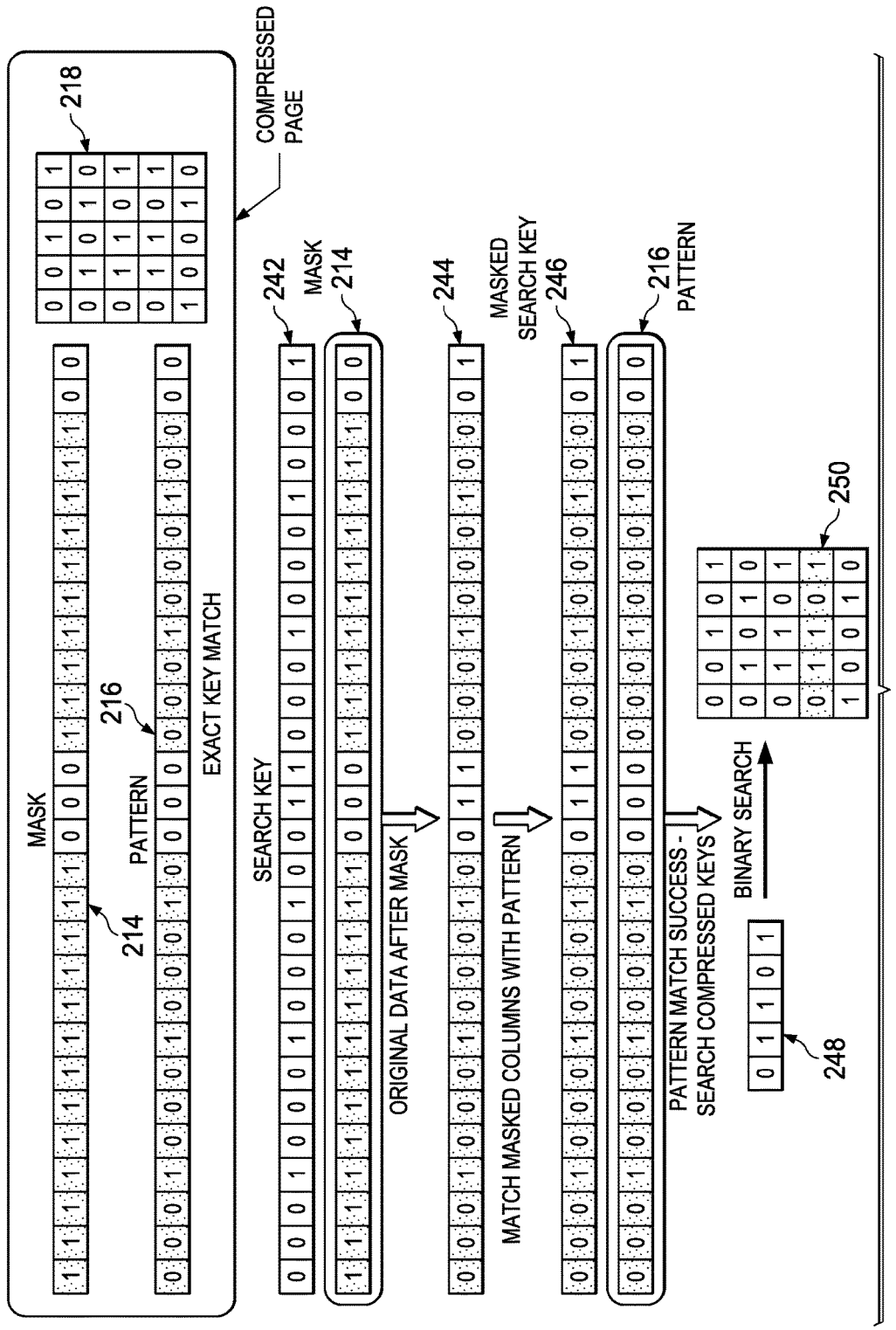
FIG. 9 illustrates an embodiment method of searching for a compressed key.

FIG. 9 illustrates a search for an exact match of a search key. Initially, search key 242 is compared to mask 214 to produce masked search key 246. In masked search key 246, mask 214, pattern 216, and masked original data 244 the highlighted bits indicate that those bits are the same for all of the multi-dimensional keys in the leaf page. Bits of search key 242 that mask 214 indicates are the same for all of the multi-dimensional keys in the leaf page, are compared to pattern 216. When the masked bits of search key 242 do not match pattern 216, none of the multi-dimensional keys on the leaf page match search key 242, and the search may be concluded with a result of no match found. When the masked bits of the search key 242 do match pattern 216, the bits of search key 242 that are not masked are compared to compressed multi-dimensional keys 250. Compressed search key 248 indicates the bits of search key 242 that correspond to the bits that vary across the different multi-dimensional keys in the leaf page. Compressed search key 248 is compared to compressed multi-dimensional keys 250. If compressed search key 248 matches one of compressed multi-dimensional keys 250, search key 242 matches the multi-dimensional key corresponding to that compressed key. For example, in FIG. 9, the compressed search key matches the fourth multi-dimensional key. However, if compressed search key 248 does not match any of compressed multi-dimensional keys 250, search key 242 does not match any of the multi-dimensional keys in the leaf page. There is no need to decompress the compressed multi-dimensional keys 250 to carry out the search, because the search is carried out directly on the compressed multi-dimensional keys. Because the compressed keys are all of the same size, and the keys are ordered, binary search can be carried out if the keys are stored consecutively in an array.

Figure 10:
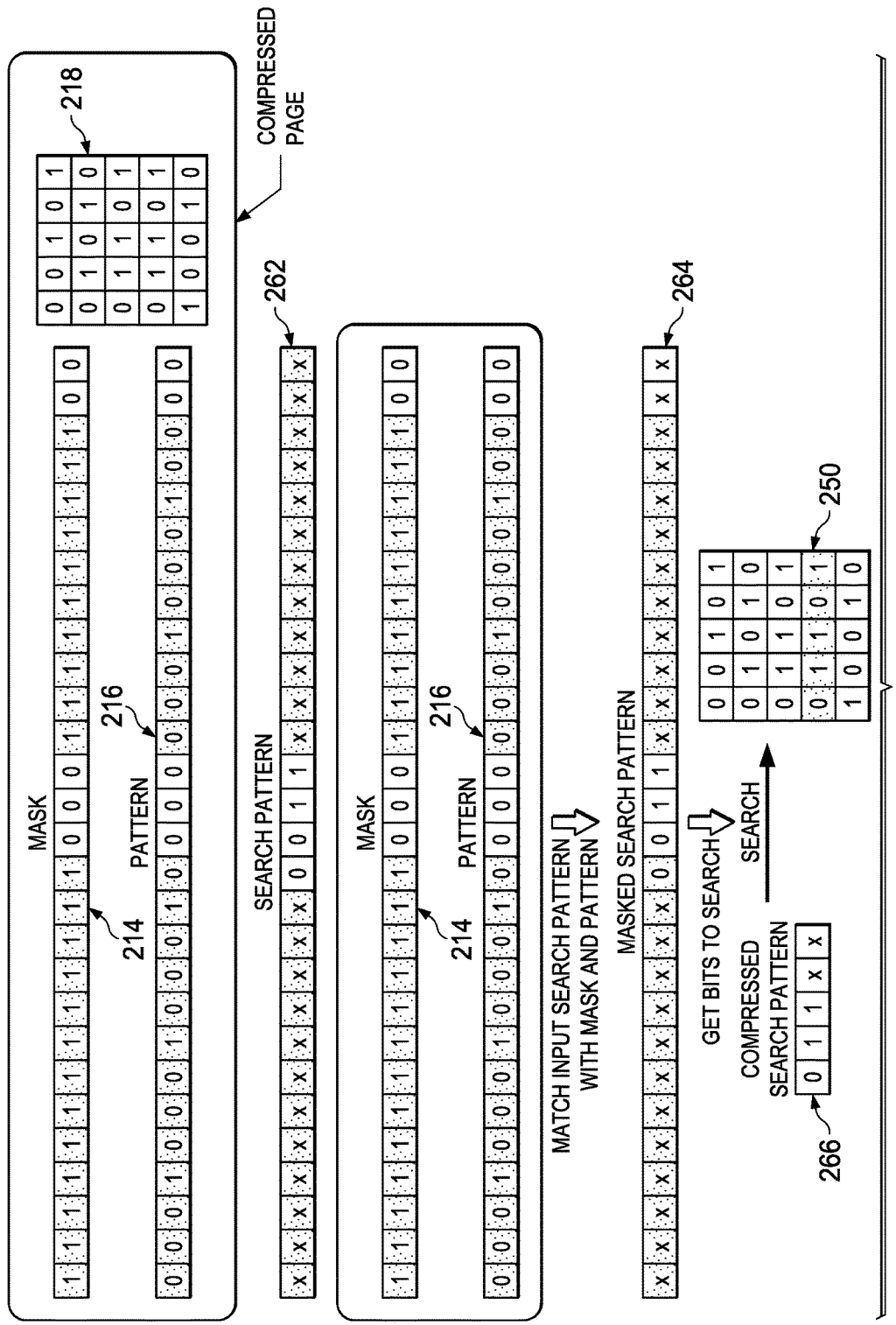
FIG. 10 illustrates another embodiment method of searching for a compressed key.

FIG. 10 illustrates a pattern search, where the objective of the search is to find all multi-dimensional keys in a leaf page that have a certain pattern of bits present at certain locations. To carry out the search, search pattern 262 is masked with common bit pattern of mask 214 to produce masked search pattern 264. Search pattern 262 has an x for bits that are not to be searched for, which are highlighted, and bit numbers for the bits to be searched for, which are not highlighted. In masked search pattern 264, the masked bits are highlighted. The masked bits of search pattern 262 are compared to the bits in pattern 216. If the masked bits of search pattern 262 do not match pattern 216, then there is no match on this leaf page. If the masked bits of search pattern 264 do match pattern 216, as in FIG. 10, compressed search pattern 266 is created, which contains the unmasked bits of search pattern 262. The bits of the compressed search pattern 266 that contain a bit value are compared to compressed multi-dimensional keys 250. There may be one match, no matches, or multiple matches in a leaf page. In FIG. 10, there is one match to the fourth compressed multi-dimensional key. All of the compressed keys that match search pattern 262 are returned as matches. There is no need to decompress all the keys to perform when this search is performed.

Figure 11:
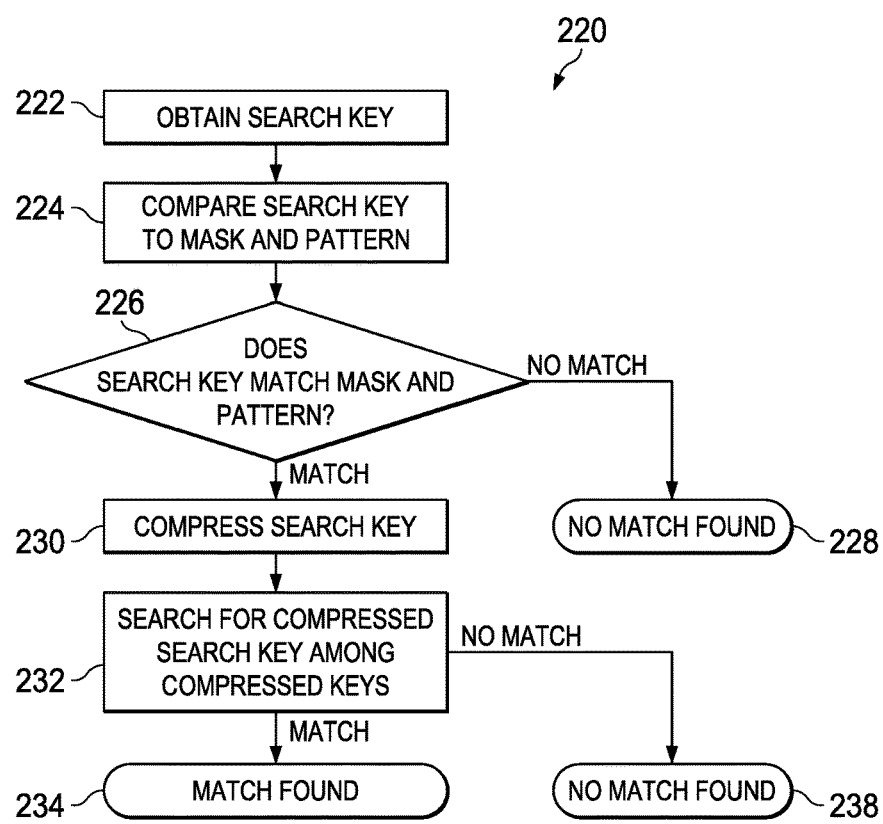
FIG. 11 illustrates an embodiment method of searching for a key.

FIG. 11 illustrates flowchart 220 depicting a method of searching for a multi-dimensional key, which may be used to search for an exact match of a search key or for a search pattern. If the search is performed using a search pattern, only the bits of the search pattern that have a value are compared to the pattern or the compressed keys. Initially, in step 222, a search key is obtained. Next, in step 224, the search key is compared to the mask and the pattern to determine if the mask and the pattern match the search key. The mask and the pattern match the search key if, when the mask is applied to the search key, the masked bits of the search key match the masked bits of the pattern. In step 226, it is determined if the search key matches the mask and the pattern. If there is no match, no match is found in step 228, the search may end. Alternatively, a new search may be performed on another page. If there is a match, the system proceeds to step 230, where it compresses the search key using mask and pattern. Then it proceeds to step 232, where it compares the compressed search key to each of the compressed keys within the page. If there is a match, the system, in step 234, indicates a match was found. If there is no match, the system goes to step 238 and indicates no match was found.

Figure 12:
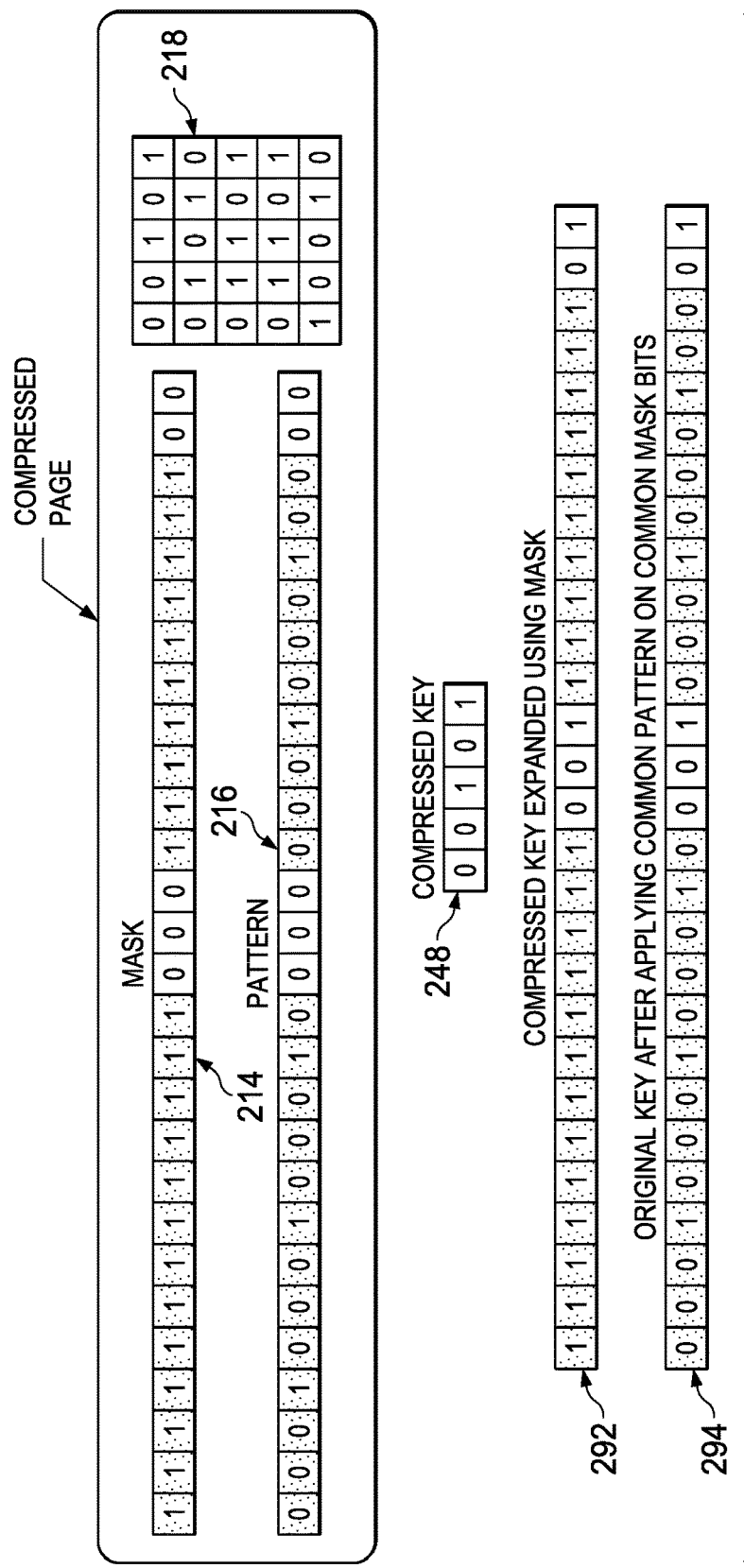
FIG. 12 illustrates decompression of a compressed key.

If there is a match in a search, the matched compressed key may be decompressed. FIG. 12 illustrates flowchart 220 of the decompression of a compressed multi-dimensional key. Compressed search key 248 is expanded to compressed key expanded using mask 214, where the masked bits are highlighted, in this example is, and the compressed multi-dimensional key bits are placed in the unmasked slots. Then, the masked bits of pattern 216 are added, to expanded key 292, producing original multi-dimensional key 294. Original multi-dimensional key 294 may then be expanded using a dictionary.

Figure 13:
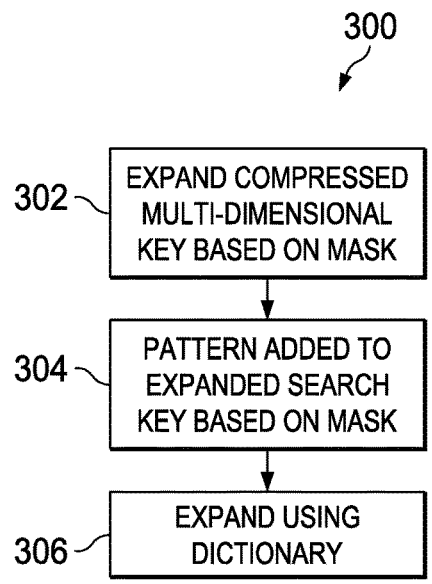
FIG. 13 illustrates an embodiment method of decompressing a compressed key.

FIG. 13 illustrates flowchart 300 of a method of decompressing a compressed multi-dimensional key. Initially, in step 302, the compressed multi-dimensional key is expanded using a mask, where the compressed multi-dimensional key fills in the unmasked bit slots of the mask. Then, in step 304, the masked bits are filled with the values from the pattern. Finally, in step 306, the multi-dimensional key is expanded using a dictionary.

In another embodiment, the compression and search methods may be applied to other systems where data is sorted based on value. The compression and search method may be used in any type of indexing scheme based on composite keys, where a composite key consists of a concatenation of keys based on individual attributes. The compression scheme may also be applied in data stored in files using an indexing mechanism based on the composite keys consisting of concatenation of keys based on individual attributes.

Figure 14:
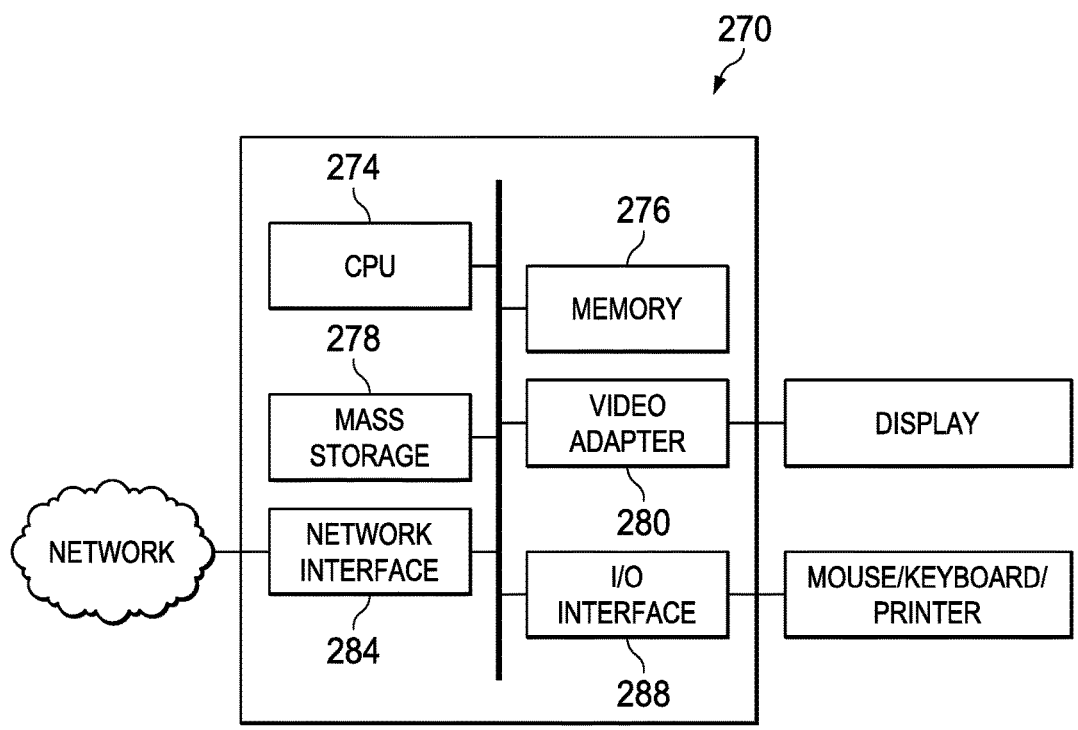
FIG. 14 illustrates a schematic diagram of an embodiment of a general-purpose computer system.

FIG. 14 illustrates a block diagram of processing system 270 that may be used for implementing the devices and methods disclosed herein. Specific devices may utilize all of the components shown, or only a subset of the components, and levels of integration may vary from device to device. Furthermore, a device may contain multiple instances of a component, such as multiple processing units, processors, memories, transmitters, receivers, etc. The processing system may comprise a processing unit equipped with one or more input devices, such as a microphone, mouse, touchscreen, keypad, keyboard, and the like. Also, processing system 270 may be equipped with one or more output devices, such as a speaker, a printer, a display, and the like. The processing unit may include central processing unit (CPU) 274, memory 276, mass storage device 278, video adapter 280, and I/O interface 288 connected to a bus.

The bus may be one or more of any type of several bus architectures including a memory bus or memory controller, a peripheral bus, video bus, or the like. CPU 274 may comprise any type of electronic data processor. Memory 276 may comprise any type of system memory such as static random access memory (SRAM), dynamic random access memory (DRAM), synchronous DRAM (SDRAM), read-only memory (ROM), a combination thereof, or the like. In an embodiment, the memory may include ROM for use at boot-up, and DRAM for program and data storage for use while executing programs.

Mass storage device 278 may comprise any type of storage device configured to store data, programs, and other information and to make the data, programs, and other information accessible via the bus. Mass storage device 278 may comprise, for example, one or more of a solid state drive, hard disk drive, a magnetic disk drive, an optical disk drive, or the like.

Video adaptor 280 and I/O interface 288 provide interfaces to couple external input and output devices to the processing unit. As illustrated, examples of input and output devices include the display coupled to the video adapter and the mouse/keyboard/printer coupled to the I/O interface. Other devices may be coupled to the processing unit, and additional or fewer interface cards may be utilized. For example, a serial interface card (not pictured) may be used to provide a serial interface for a printer.

The processing unit also includes one or more network interface 284, which may comprise wired links, such as an Ethernet cable or the like, and/or wireless links to access nodes or different networks. Network interface 284 allows the processing unit to communicate with remote units via the networks. For example, the network interface may provide wireless communication via one or more transmitters/transmit antennas and one or more receivers/receive antennas. In an embodiment, the processing unit is coupled to a local-area network or a wide-area network for data processing and communications with remote devices, such as other processing units, the Internet, remote storage facilities, or the like.

Advantages of an embodiment include the effective compression of multi-dimensional keys of a constant size within a leaf page by removing redundancies that are present throughout the key without significantly affecting query performance. Also, an embodiment enables a high compression ratio that enables large amounts of MOLAP data to be analyzed quickly by storing the data entirely in-memory. Additionally, an example enables a fast search, because the compressed keys may not be decompressed during searching. In an embodiment, a total compression ratio of 20:1 is achieved, with a marginal compression ratio of 2.5:1. Also, an embodiment enables enhanced scalability and robustness, because additional dictionary entries can be added, but unused additional bits can be compressed away.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method comprising:
   obtaining, by a computer, a plurality of compressed multi-dimensional keys, wherein each key of the plurality of multi-dimensional keys has a same bit length;
   determining, by the computer, a plurality of common bits, wherein each common bit has a respective same value and occurs in a respective same bit position in all of the plurality of multi-dimensional keys;
   generating, by the computer, a mask having the bit length, wherein the mask contains a first binary value in mask bit positions corresponding to common bit positions, and a second binary value in mask bit positions that do not correspond to common bit positions;
   generating, by the computer, a pattern having the bit length, wherein the pattern comprises the common bit values in their respective bit positions and a third binary value in pattern bit positions that do not correspond to common bit positions, the third binary value being either the first binary value or the second binary value; and
   associating, by the computer, the mask and the pattern with the compressed multidimensional keys for use in retrieving data;
   for each dimension of a plurality of dimensions, determining all unique values of the dimension in a plurality of rows and associating a respective binary value with each unique value; and
   for each row, generating one of the compressed multi-dimensional keys by concatenating the associated binary values corresponding to the values of the dimensions of the row.

2. The method of claim 1, further comprising: adding each unique compressed multidimensional key to a dictionary.

3. The method of claim 1, wherein storing the mask and the pattern comprises storing the mask and the pattern in an indexing structure.

4. An apparatus comprising:
   one or more processors; and
   a memory coupled to the one or more processors and storing instructions, the instructions configured to, when executed by the one or more processors, cause the one or more processors to perform operations comprising:
   obtaining a plurality of compressed multi-dimensional keys, wherein each key of the plurality of multi-dimensional keys has a same bit length;
   determining a plurality of common bits, wherein each common bit has a respective same value and occurs in a respective same bit position in all of the plurality of multidimensional keys;
   generating a mask having the bit length, wherein the mask contains a first binary value in mask bit positions corresponding to common bit positions, and a second binary value in mask bit positions that do not correspond to common bit positions;
   generating a pattern having the bit length, wherein the pattern comprises the common bit values in their respective bit positions and a third binary value in pattern bit positions that do not correspond to common bit positions, the third binary value being either the first binary value or the second binary value; and
   associating the mask and the pattern with the compressed multi-dimensional keys for use in retrieving data;
   wherein the operations further comprise:
   for each dimension of a plurality of dimensions, determining all unique values of the dimension in a plurality of rows and associating a respective binary value with each unique value; and
   for each row, generating one of the compressed multi-dimensional keys by concatenating the associated binary values corresponding to the values of the dimensions of the row.

5. The apparatus of claim 4, wherein the operations further comprise: adding each unique compressed multidimensional key to a dictionary.

6. The apparatus of claim 4, wherein storing the mask and the pattern comprises storing the mask and the pattern in an indexing structure.

* * * * *